United States Patent [19]
Townsend

[11] Patent Number: 5,588,861
[45] Date of Patent: Dec. 31, 1996

[54] ZIF CHIP SOCKET

[75] Inventor: Peter K. Townsend, Camp Hill, Pa.

[73] Assignee: Berg Technology, Inc., Reno, Nev.

[21] Appl. No.: 367,085

[22] Filed: Dec. 30, 1994

Related U.S. Application Data

[63] Continuation-in-part of Ser. No. 275,959, Jul. 15, 1994.

[51] Int. Cl.$^6$ .................................................. H01R 4/50
[52] U.S. Cl. ........................................ 439/342; 439/259
[58] Field of Search .......................... 439/342, 259–264, 439/266, 268, 269, 885

[56] References Cited

U.S. PATENT DOCUMENTS

| | | | |
|---|---|---|---|
| 4,375,309 | 3/1983 | Griffin . | |
| 4,420,205 | 12/1983 | Kirkman . | |
| 4,674,811 | 6/1987 | Corwin | 439/259 |
| 4,750,891 | 6/1988 | Egawa | 439/259 |
| 4,887,974 | 12/1989 | Ichimura et al. | 439/259 |
| 4,988,310 | 1/1991 | Bright et al. | 439/342 |
| 5,342,214 | 8/1994 | Hsu | 439/342 |
| 5,370,549 | 12/1994 | Lee | 439/342 |

OTHER PUBLICATIONS

*ECN*; ZIF PGA Sockets Product Literature.
PGA Socket arts insertion forces by up to two–thirds, ECN, 2 pages.

*Primary Examiner*—Hien D. Vu
*Attorney, Agent, or Firm*—Daniel J. Long; M. Richard Page

[57] ABSTRACT

The present invention provides a pin grid array (PGA) socket for electrically connecting pins of an integrated circuit to a circuit substrate. The PGA socket according to the invention included a cover having insertion holes arranged in rows and columns for receiving the pins of the integrated circuit and a base for supporting a plurality of deflectable contacts. The cover provides a buttress extending from each insertion hole. The contacts are preferably freely supported in the base and spaced on either about 0.5 inch centers or on about 0.1 inch centers. The centerlines of the insertion holes are correspondingly spaced approximately 0.5 inches or approximately 0.1 inches. The cover preferably provides a camming means. The cover can be slidably attached to the base to permit the cover to cam over the surface of the base. When the pins have been inserted through the insertion holes, the buttresses provide support for the pins of the integrated circuit as they are moved with the cover to interface with the contacts and while the interface between the contacts and the pins is maintained. In one preferred embodiment means are also provided to support the contacts.

1 Claim, 8 Drawing Sheets

ZIF CHIP SOCKET

CROSS REFERENCE TO RELATED APPLICATIONS

This is a continuation-in-part of a copending application Ser. No. 08/275,959, filed Jul. 15, 1994, and entitled "ZIF for Plastic Chip Carrier".

BACKGROUND OF THE INVENTION

1. Field of the Invention

The present invention relates to electrical connectors and, more particularly, to zero-insertion force pin grid array sockets for use in connecting an integrated circuit to a circuit substrate.

2. Brief Description of the Prior Developments

Pin grid array (PGA) sockets are used for connecting an integrated circuit, such as an ASIC (application-specific integrated circuit), to a circuit substrate, such as a printed circuit board. PGA sockets typically comprise a base that supports a plurality of contacts and a cover with insertion holes. The base is mounted on the circuit substrate to form an electrical connection with circuits on the circuit substrate. The cover is attached to the base prior to assembly of the circuit substrate so that the lateral surfaces of the circuit substrate, base and cover are stacked in a parallel arrangement.

When it is desired to connect an IC to the circuit substrate, the pins of the IC are forcibly inserted into the insertion holes of the cover and against the contacts to form an electrical connection there between. The insertion force required to establish an adequate electrical connection is considerable and can lead to difficulty in installing and removing the IC. Moreover, the pins of the IC may be easily damaged as a result of its installation and removal.

Therefore, low insertion force (LIF) and zero insertion force (ZIF) PGA sockets have been developed to reduce the insertion forces needed to establish an electrical interface between the contacts and the pins. The covers of LIF or ZIF PGA sockets are typically attached to the base so that the cover is movable over the lateral surface of the base. A means for camming the cover over the surface of the base so that the contacts are deflected against the pins of the IC is provided. The base cover usually has contact support walls for supporting the individual contacts.

These LIF and ZIF devices, however, also can cause the pins of the ICs to be damaged. For example as the cover moves over the surface of the base, the pins are guillotined against the contacts and, as a result, can be broken or bent. Additionally, the mating force between the contact and the pin may damage the pin since the pins themselves are not provided with any support.

PGA socket covers have rows and columns of insertion holes. The exact number of insertion holes and the orientation of the insertion holes typically depends on the types of ICs to be connected to the circuit substrate. The rows and columns of insertion holes are spaced on 0.1-inch or 0.1-inch interstitial centers to accommodate the pin densities of most ICs available today. However, advancement in technology has resulted in the development of smaller or denser ICs with pins spaced on 0.05-inch centers.

Therefore, there is a need for a PGA socket that can be used to connect an IC to a circuit substrate without damaging the pins of the IC. Moreover, the PGA socket should be compatible with chips having pins spaced on either 0.1-inch or 0.05-inch centers.

SUMMARY OF THE INVENTION

This need is fulfilled by the present invention which provides a pin grid array socket for connecting an integrated circuit (IC) to a circuit substrate. The PGA socket according to the invention comprises a base for supporting a plurality of contacts, a cover having a plurality of insertion holes for receiving the plurality of pins and being slidably attached with the base so that the plurality of pins can be moved to form an electrical interface with the plurality of contacts, and a plurality of buttresses connected to the cover for supporting the plurality of pins. In a preferred embodiment, the insertion holes are arranged in rows and columns and the plurality of buttresses form rows coincident with one of the rows and columns of insertion holes. In an alternative embodiment, the insertion holes form an array of rows and columns where adjacent rows and adjacent columns are staggered, each insertion hole being individually connected to one of the plurality of buttresses.

A relief space between the plurality of contacts and the cover may preferably be provided when the base and the cover are attached to prevent burr formation from the contacts on the inner surface of the cover.

In a preferred embodiment, a camming means is operatively connected with the cover for camming the cover to slidably move relative to the base. In this preferred embodiment, the camming means is capable of slidably moving the cover no more than about 0.01 inches to cause the pins to form an electrical interface with the plurality of contacts.

The plurality of contacts may be supported in the base on about 0.1-inch centers or less. Alternatively, the plurality of contacts may be supported in the base on about 0.05-inch centers. A cover is selected with either (1) adjacent rows and adjacent columns of insertion holes spaced on about 0.05-inch centers; or (2) adjacent rows and adjacent columns of insertion holes spaced on about 0.1-inch centers.

The plurality of contacts may also be freely supported by the base and capable of deflecting about 0.01 inches in response to a normal force of at least about 100 grams in a preferred embodiment.

A method of assembling a pin grid array socket is also provided by the present invention. According to the inventive method, a plurality of contacts are stamped from a plate of conductive material. The plurality of contacts are then inserted into a base so that they are supported by the base. A cover having a plurality of insertion holes with buttresses extending therefrom is molded and then attached to the base so that the plurality of contacts and the buttresses are disposed between the base and the cover. A means for camming the cover with respect to the base is preferably connected to the cover before the cover is attached to the base.

In a preferred embodiment, the means for camming is capable of camming the cover about 0.01 inches with respect to the base. The cover is preferably attached to the base so that the cover is slidable in a direction substantially parallel to the base and over a lateral surface of the base.

In a more preferred embodiment, the plurality of contacts are stamped on about 0.05-inch centers, 0.1 inch interstitial centers, or 0.1 inch centers and supported in the base on their stamped centers. The plurality of insertion holes are correspondingly arranged in rows and columns such that the centerline of adjacent rows and the centerline of adjacent columns are separated by either about 0.1 inches or about 0.05 inches.

A method of using a pin grid array socket to interface an integrated circuit to a circuit substrate is also provided by the present invention. According to the method, a base supporting a plurality of contacts is connected to the circuit substrate. A cover with a camming means and a plurality of insertion holes with corresponding buttresses is attached to the base so that the plurality of contacts and the buttresses are disposed between the cover and the base. The pins of the integrated circuit may then be inserted through the insertion holes and the cover cammed to slidably move the pins into contact with the plurality of contacts to form an electrical interface there between. The buttresses provide support for the pins while the cover is cammed and while the electrical interface is maintained between the pins and the plurality of contacts.

In another preferred embodiment means are also provided to support the contacts. Such means may be spring supports which extend from the cover and may be integral with the contact. Such support may also include buttresses which project upwardly from the base. When the contact bears against the spring support that spring support will flex to bear against the buttress which projects upwardly from the base.

BRIEF DESCRIPTION OF THE DRAWINGS

The present invention will be better understood, and its numerous objects and advantages will become apparent by reference to the following detailed description of the invention, when taken in conjunction with the following drawings, in which.

DETAILED DESCRIPTION OF THE PREFERRED EMBODIMENT

Figure 1:
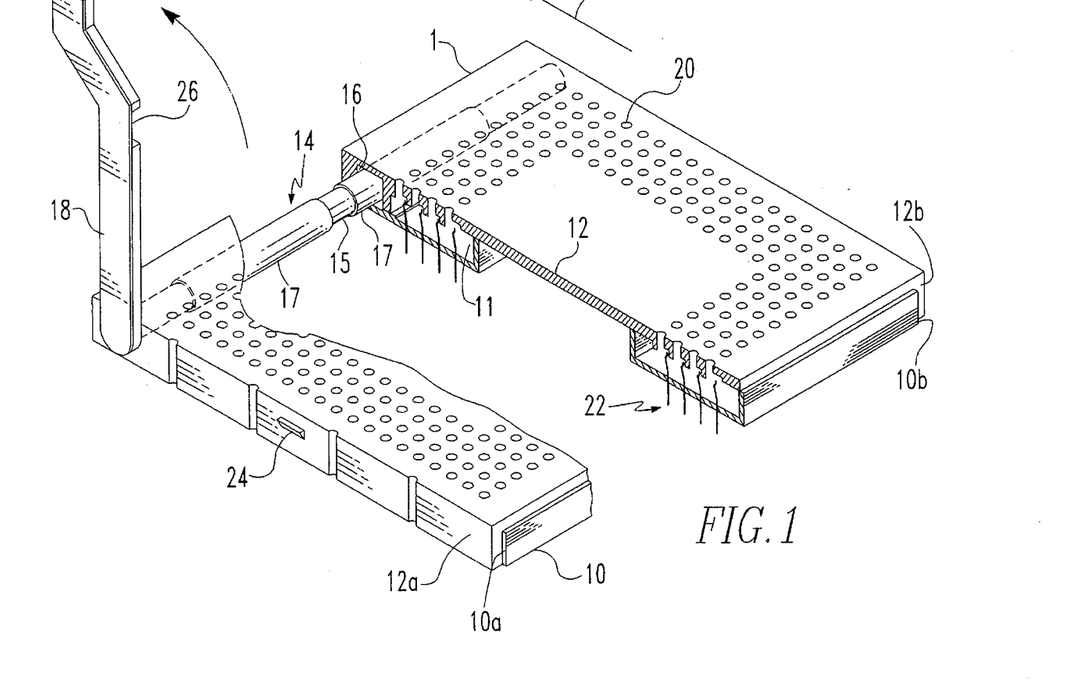
FIG. 1 shows a partial cross section of a PGA socket according to the invention.

FIG. 1 shows a partial cross section of a PGA socket 1 according to the invention. A base 10 and a cover 12 are shown attached together. The base and cover are preferably made of a plastic-like material, such as liquid crystal polymer, so that the walls 10a, 10b, of the base and the walls 12a, 12b of the cover are sufficiently flexible to permit the walls 12a and 12b to be snapped over ridges (not shown) of the corresponding walls 10a and 10b, respectively, to secure the cover to the base.

Figure 1A:
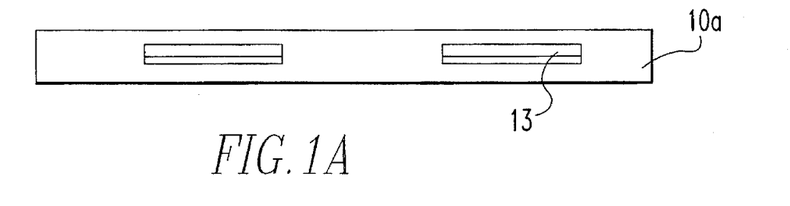
FIG. 1A shows an example of a wall of the base of a PGA socket according to the invention.
Figure 1B:
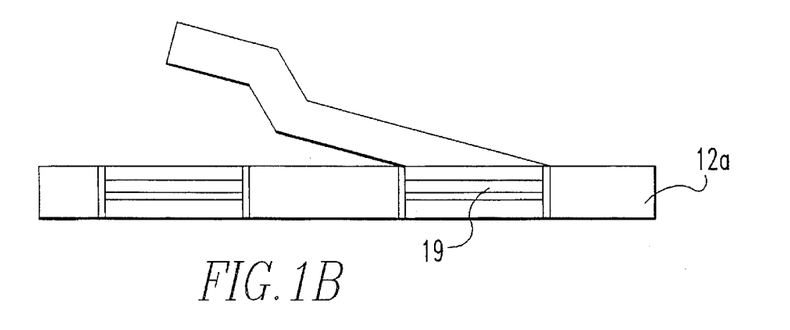
FIG. 1B shows an example of a wall of the cover of a PGA socket according to the invention.

FIG. 1A shows one example of the outer surface of wall 10a (10b) of the base 10. In this example, ridges 13 are formed on the surface of the wall. FIG. 1B shows the inner surface of wall 12a (12b) of a cover designed for use with the base shown in FIG. 1A. Wall 12a (12b) preferably provides slots 19 that are large enough to snap over ridges 13 and long enough to permit movement along ridges 13.

Referring back to FIG. 1, the base and cover cooperate to form an opening 16 through the PGA socket 1 in a plane perpendicular to the walls 10a, 10b, 12a, 12b. A cam 14 is disposed through the opening 16 and integrally connected to a cam bar 18. The cam bar 18 can be pivotally moved to cam the cover 12 over the lateral surface 11 of the base and along the walls 10a, 10b. A notch 26 and a latch 24 are preferably formed on the cam bar 18 and the wall 12a of the cover, respectively, for use in latching the cam bar 18 in place as explained below.

The cam 14 preferably comprises a bearing surface 15 and two camming surfaces 17. The bearing surface 15 and camming surfaces 17 are generally cylindrical. The larger diameter camming surfaces 17 are connected to each end of the bearing surface so that the center axis of the camming surfaces are coaligned but offset with respect to the center axis of the bearing surface so that a portion of the camming surfaces are flushed with a portion of the bearing surface and the remaining portions of the camming surfaces extend beyond the bearing surface as shown in the figure. Thus, when the cam bar 18 is lifted as shown, the camming surfaces are forced against the upper portion of the opening 16 in a counter clockwise direction. As a result, the cover is slidably moved over the lateral surface of the base in the direction shown by arrow 28. It should be understood that cam 14 can be configured in numerous ways to effect the necessary camming and that the cam shown in FIG. 1 is merely illustrative of an exemplary cam for camming the cover over the base.

Figure 2:
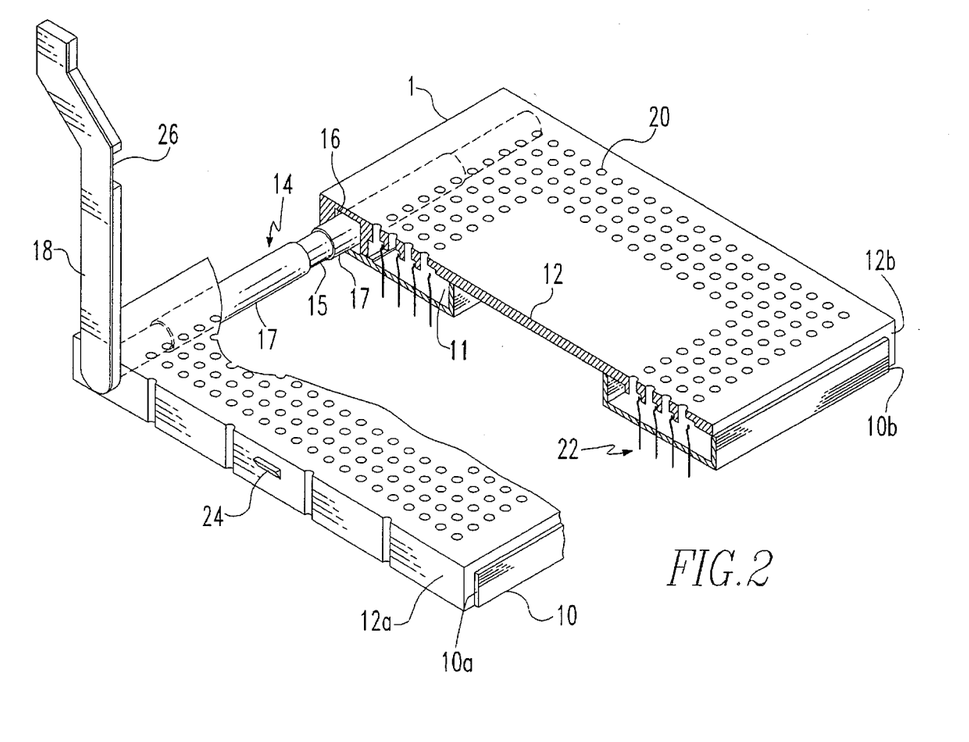
FIG. 2 shows an alternative embodiment of FIG. 1 in which the rows and columns of insertion holes are staggered.

A plurality of contacts 22 are supported in the base 10 as shown in FIG. 1. The top surface of the cover 12 provides a plurality of insertion holes 20. The insertion holes 20 are generally arranged in rows and columns as shown in FIG. 1. In an alternative embodiment shown in FIG. 2, the rows and columns of insertion holes may be staggered. The insertion holes 20 should be dimensionally large enough to receive the pins of an IC without measurable insertion force. The plurality of contacts 22 are also preferably arranged in rows and columns so that each insertion hole corresponds to one contact. In some instances, there may be more contacts than insertion holes as is explained below.

Figure 3:
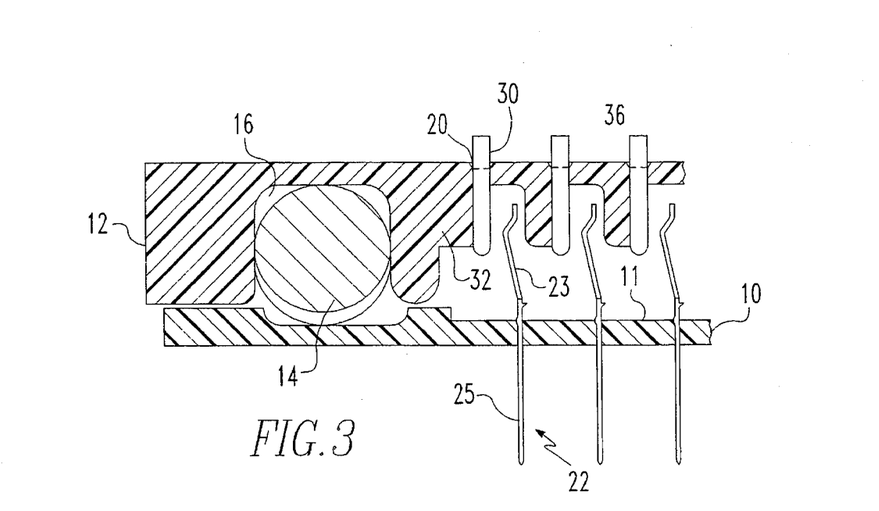
FIG. 3 is an enlarged cross section of a PGA socket according to the invention with the cam in an open position.

FIG. 3 is an enlarged cross section of a PGA socket according to the invention with the cam in an open position. The contacts 22 comprise a movable contact beam element 23 and a base member 25. When the cam bar 18 is lifted as shown in FIG. 1, the pins 30 of an IC can be inserted through insertion holes 20 without being forcibly pressed against the contacts beam elements 23. A buttress 32 integrally connected to the cover 12 extends downward from each of the insertion holes 20 toward the base 10. Each buttress 32 forms a means for supporting a pin received through the insertion hole 20 associated with the buttress.

Figure 4:
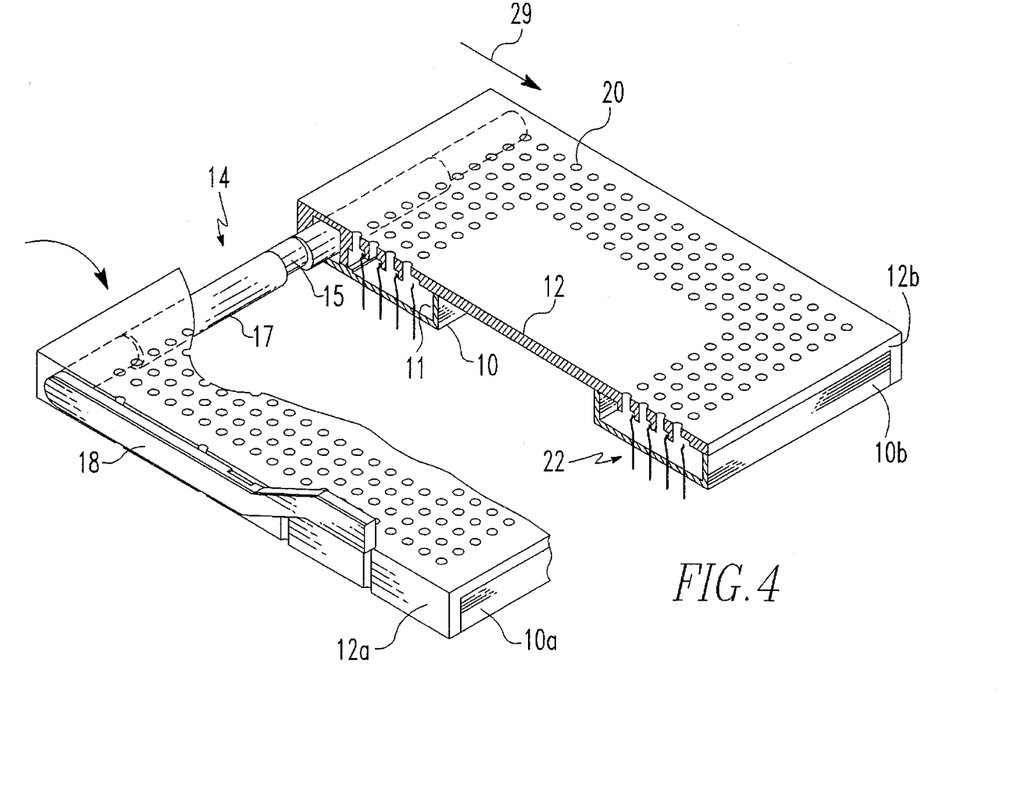
FIG. 4 shows the PGA socket of FIG. 1 with the cam bar latched in its closed position.
Figure 5:
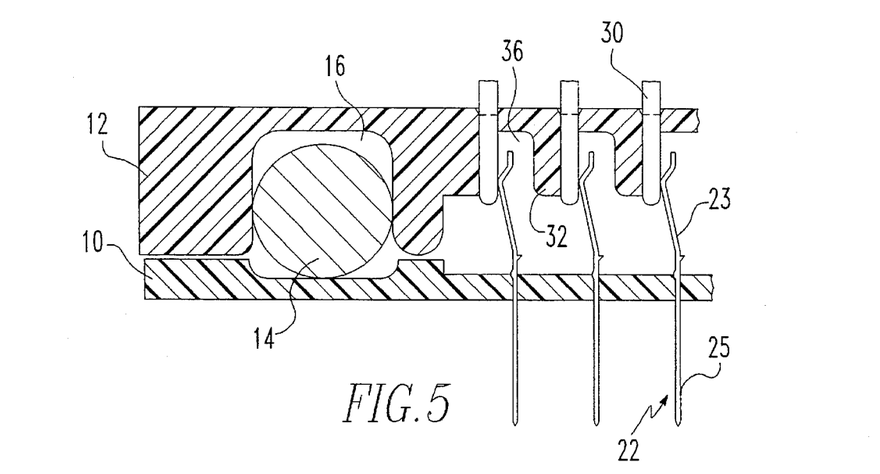
FIG. 5 shows an enlarged cross section of a PGA socket with the cam in the closed position.

FIG. 4 shows the PGA socket of FIG. 1 with the cam bar latched in its closed position and FIG. 5 shows an enlarged cross section of a PGA socket with the cam bar 18 in the closed position. When the cam bar 18 is pivoted from its open position to its closed position shown in FIG. 4, the camming surfaces 17 create a clockwise force against the opening 16 causing the cover 12 to slide along the base 10 in the direction of arrow 29. As the cover 12 moves with pins 30 inserted into the insertion holes 20, the buttresses 32 provide support for the pins. Without this support the pins are essentially guillotined against the contacts 22 causing the pins to break or bend as described above.

A relief space 36 (FIGS. 3 and 5) is preferably provided between the contact beam elements 23 and the cover 12. The purpose of the relief space is to prevent the contact beam elements from forming burrs in the cover as the cover is cammed to slide over the base. The addition of relief space 36 may also eliminate contact bending as the cover is cammed over the contacts.

The camming motion preferably provides enough movement of the cover to bring each of the pins 30 into contact with a respective contact beam member 23 with sufficient force to establish a stable electrical interface between each pin 30 and a respective contact 22. In a preferred embodiment, the contact beam element 23 may be deflected by a pin so that the normal force exceeds about 70 grams. According to this preferred embodiment, the cover is moved about 0.01 inches by the cam to produce a normal force of at least about 70 grams.

In a preferred embodiment, the contacts 22 are freely supported by the base as shown in FIGS. 3 and 5. Each contact is preferably about 0.005 inches thick and made of beryllium copper. In this preferred embodiment, the contact beam element has a working length of approximately 0.110 inches. When tolerances drive the contact beam beyond 0.01 inches it does not yield but rather allows the normal force to exceed about 100 grams.

Standard ICs typically provide pins that are spaced on 0.1-inch centers. Thus, most PGA sockets provide insertion holes spaced on 0.1-inch centers with respective contact beam elements supported in the base on 0.1-inch centers. As technology progresses, pin densities become greater and chips become smaller. It is expected that many ICs will provide pins that are spaced on 0.05-inch centers. Thus, in a preferred embodiment, the contacts are preferably stamped on 0.05-inch centers from a plate of conductive material.

Figure 6:
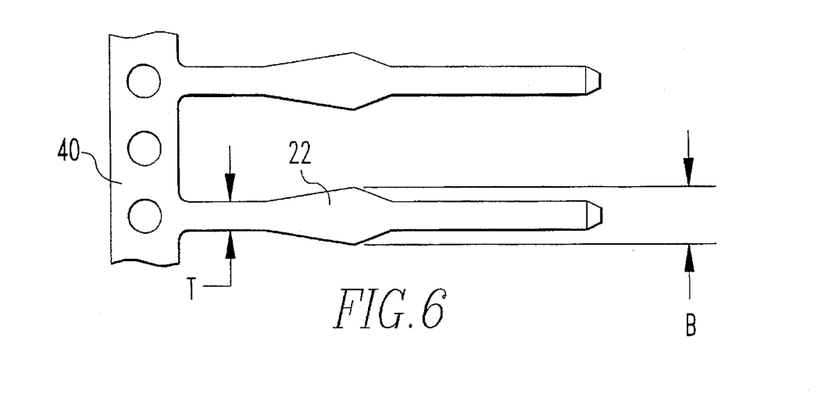
FIG. 6 shows a contact strip stamped in accordance with the present invention.

FIG. 6 shows a contact strip stamped in accordance with a preferred embodiment of the invention. The resulting contact strip contains a plurality of contacts 22 connected together by a carrier strip 40. The contact beam element 23 has a trapezoidal design with its base B having a thickness of about 0.04 inches and its top having T a thickness of about 0.02 inches. During the stamping process, the contacts are preferably shaped as shown in FIGS. 3 and 5. The plurality of contacts may then be inserted into the base so that the contacts are supported therein on 0.05-inch centers. As a result of the contact beam design, there is no need to produce a base with means for supporting the contacts.

A cover according to the invention provides insertion holes spaced on either 0.1-inch centers, 0.1-inch interstitial centers or 0.05-inch centers depending upon the types of ICs to be connected to the circuit substrate. A base with contacts spaced on 0.1-inch centers, 0.1-inch interstitial centers or 0.05-inch centers may then be mated with an appropriate cover. The cam preferably remains substantially identical regardless of the cover used.

Each contact is preferably about 0.005 inches thick and made of beryllium copper. In this preferred embodiment, the contact beam element has a working length of approximately 0.110 inches. When tolerances drive the contact beam beyond 0.01 inches it does not yield but rather allows the normal force to exceed about 100 grams.

Figure 7A:
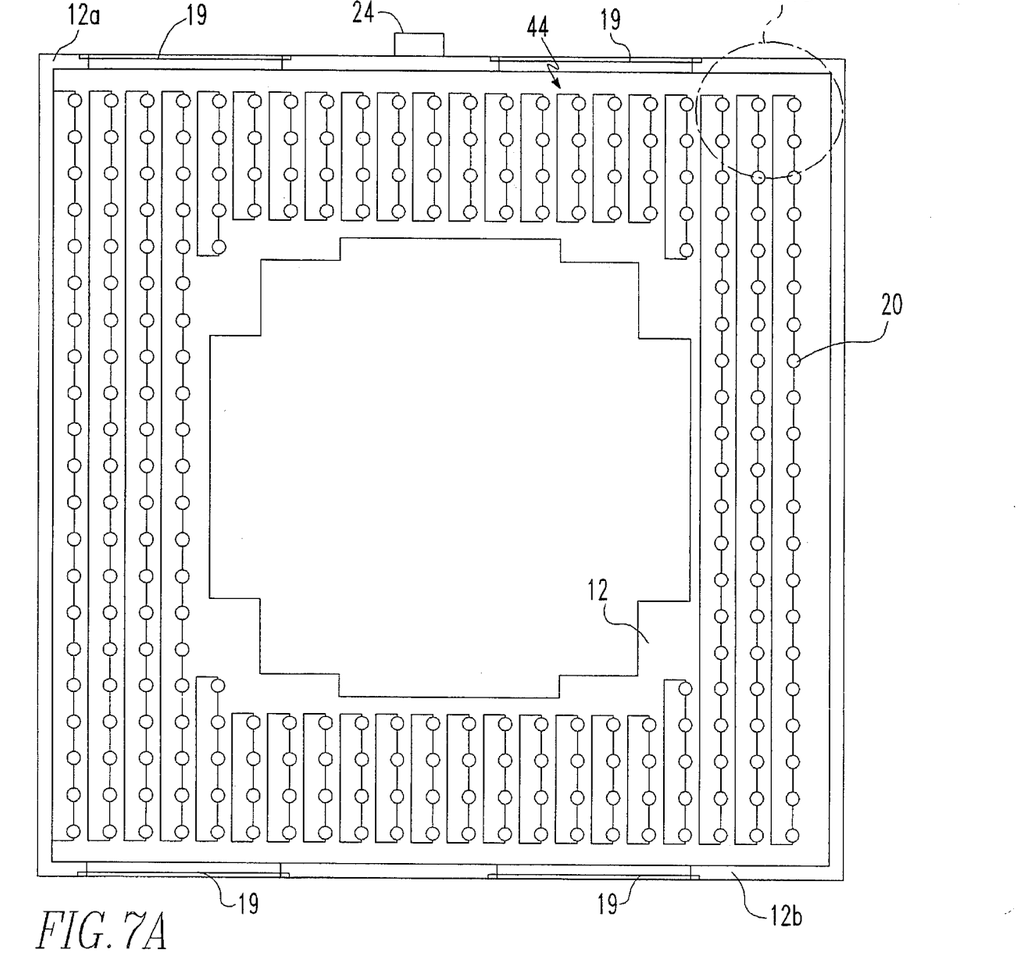
FIG. 7A shows the underside of a PGA socket cover having buttress strips according to a preferred embodiment of the invention.
Figure 7B:
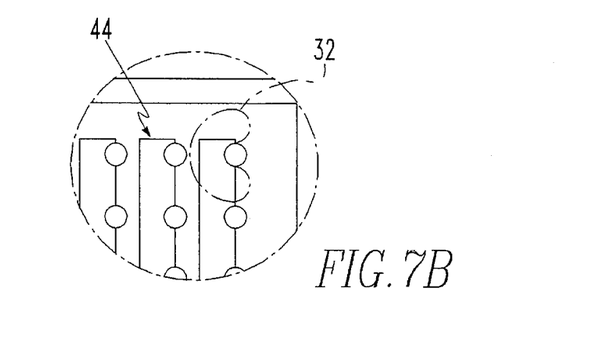
FIG. 7B shows an enlarged view of the portion of FIG. 7A shown within the dashed lines.

In a preferred embodiment, pin support buttresses are provided as strips running the length of each row or each column of insertion holes so that a portion of the strip extends from each insertion hole forming an individual buttress associated with each insertion hole. FIGS. 7A and 7B show the underside of a cover in which buttress strips 44 are formed. Individual buttresses 32 are indicated, for example, within the dashed lines. Thus, a portion of each buttress strip 44 extends from an associated insertion hole 20 to form the buttresses 32. As shown in FIGS. 7A and 7B, each buttress 32 is coextensive with its associated insertion wall such that the buttress forms an arcuate wall for a pin.

In a cover with insertion holes spaced on 0.1-inch centers, the buttress strip is preferably about 0.040 inches thick and extends downward from the cover about 0.100 inches. The thickness of the buttress may be reduced to about 0.010 inches to accommodate the closer spacing of covers with insertion holes spaced on 0.05-inch centers. In a PGA socket cover having its rows and columns of insertion holes in the staggered arrangement shown in FIG. 2, the buttresses are individually molded onto the cover with the same dimensions as set forth above. To produce a PGA socket according to the invention, a plurality of contacts connected to a detachable carrier strip are stamped from a plate of conductive material such as beryllium copper. The plurality of contacts are preferably stamped on 0.05-inch centers with the dimensions and shape described above. A base is preferably molded with insertion holes for supporting the contacts spaced on 0.05-inch centers. The contacts may then be inserted through respective insertion holes in the base. The detachable carrier strip is then preferably detached from the plurality of contacts so that the base is left supporting a plurality of contact beam elements. The base members of the contacts extend through the insertion holes of the base and can be used as through mounts for mounting the base onto a circuit substrate.

A cover having insertion holes with buttresses extending therefrom and a cam mechanism may also be molded from a plastic-like material. The cam mechanism is then operably connected to the cover. The cover is snapped onto the base as described above.

Since, the base does not require contact support walls, it is possible to reduce the spacing of the contacts supported in the base. Therefore, PGA sockets according to the invention are adaptable for use with ICs having pins spaced on 0.05-inch centers. Moreover, the elimination of the contact support walls allows the base to be easily produced.

In use the cam bar is lifted to its open position before connecting an IC to a circuit substrate. The pins of an IC are placed within the insertion holes of the cover. The cam bar is then lowered to its closed position. As the cam bar is lowered the cover is cammed to move the pins into contact with corresponding contact beam elements. The pins are thus supported by the buttresses while the cover is in motion. Once the cam bar is in its closed position, it is preferably latched into place. The cam bar is preferably sufficiently flexible to permit the cam bar to be pressed down over latch 24 (FIGS. 1 and 4). Ridge 26 (FIG. 4) provides a means for guiding the cam bar over latch 24 (FIGS. 1 and 4). In the closed position, the pins cause the contact beam elements to deflect, thereby exerting a normal force on the pins to create a stable electrical interface there between. The contact beam elements may be deflected up to about 0.01 inches so that the pins are subjected to the normal force of at least about 70 grams. Therefore, the buttresses provide additional pin support while the PGA socket is closed.

To remove the IC, the cam bar is lifted to its open position. As a result, the cover is slidably moved along the lateral surface of the base so that the pins are moved in a direction away from the contacts to break the electrical interface there between. Once, the cam bar is in the open position the pins of the IC may be retracted from the PGA socket.

Figure 8:
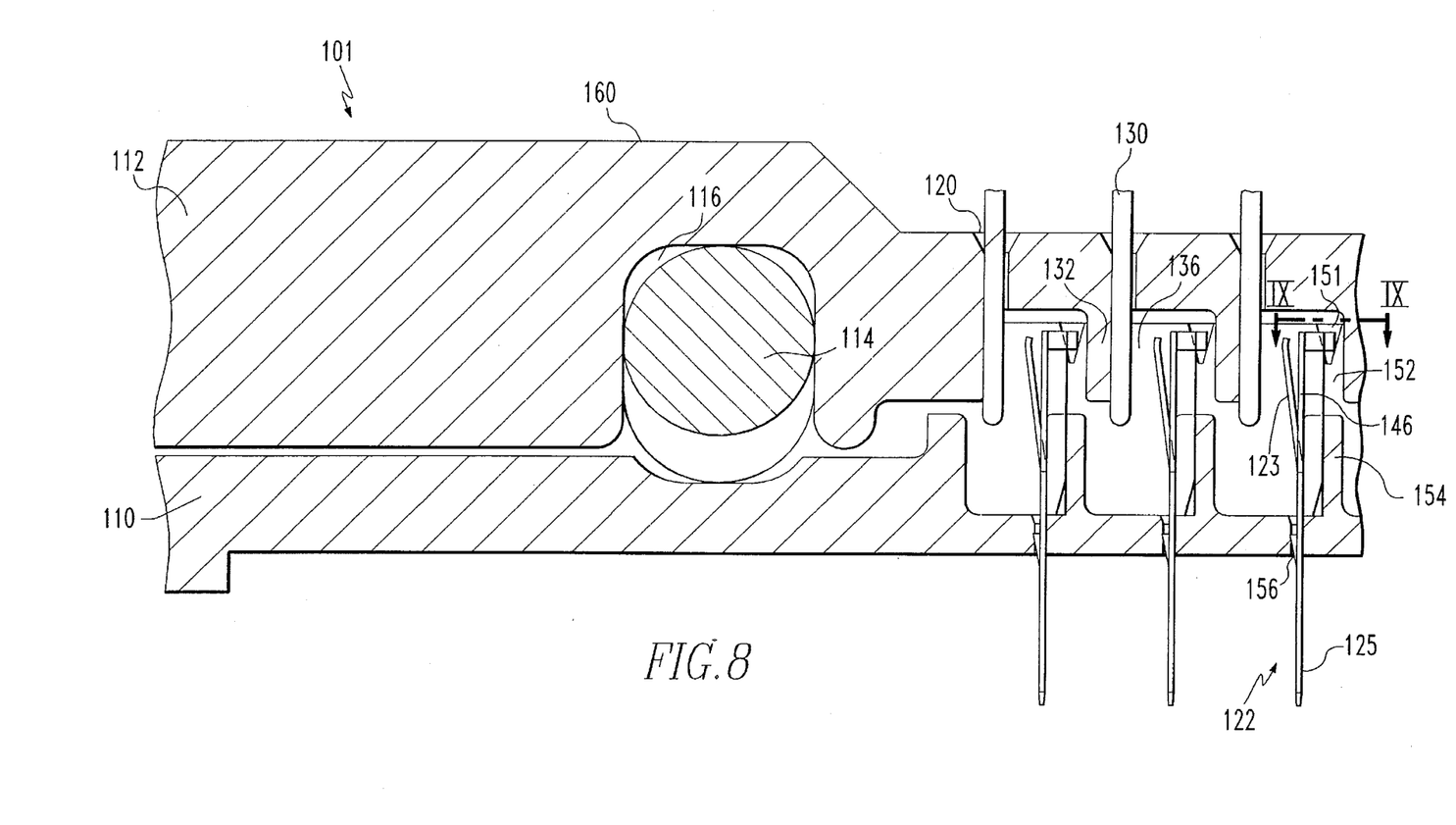
FIG. 8 is an enlarged cross sectional view similar to FIG. 3 of another preferred embodiment of the PGA socket according to the invention.
Figure 9:
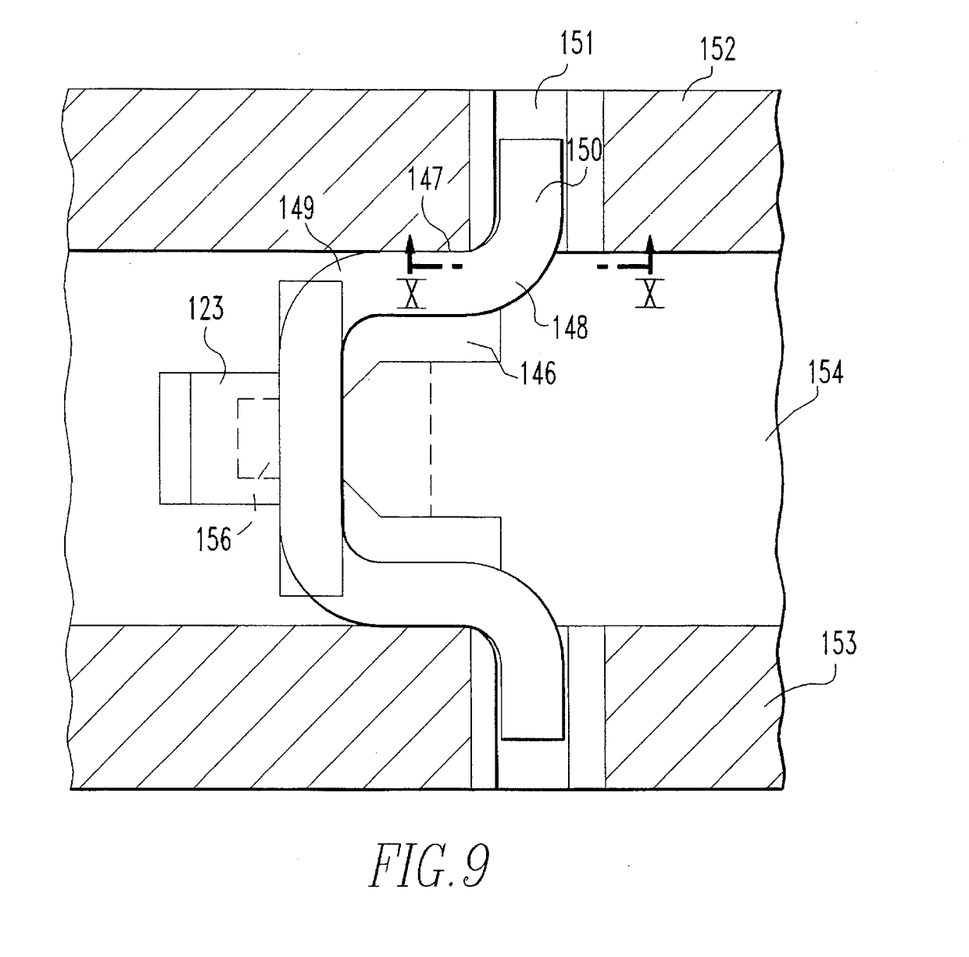
FIG. 9 is a cross sectional view through line IX—IX in FIG. 8.
Figure 10:
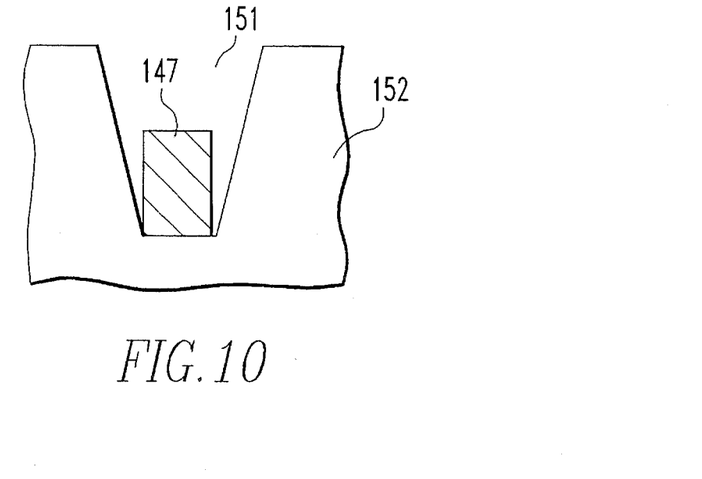
FIG. 10 is an enlarged view from line X—X in FIG. 9.

Another preferred embodiment of the PGA socket according to the present invention is shown in FIGS. 8 through 10. Referring particularly to FIG. 8, in this embodiment the PGA socket 101 includes a base 110 and a cover 112 that are, as was described above in the above described embodiments, attached together. Similarly to the first embodiment, a cam 114 is disposed through an opening 116, a plurality of contacts 122 are supported in the base 110. In FIG. 8 the cam is in an open position. The contacts 122 comprise a movable contact beam element 123 and a base member 125. When the cam bar is lifted similarly to as shown in FIG. 1, the pins 130 of an IC can be inserted through insertion holes without being forcibly pressed against the contacts beam elements 123. A buttress 132 integrally connected to the cover 112 extends downward from each of the insertion holes toward the base 110. Each buttress 132 forms a means for supporting a pin received through the insertion hole associated with the buttress. Integral with the contacts there are spring supports as at 146. These spring supports extend vertically and the contact beams element extends angularly away from it. The integral contact and spring support will preferably be phosphor bronze and will be from 0.005 to 0.007 inch in thickness and more preferably 0.006 inch. Each of these spring supports has an opposed pair of arcurate arms as at 147 which have bends 148 and 149 and which engage at their terminal ends as at 150 slots as at 151 in side wall 152 which extends upwardly from the base. This side wall runs parallel to the row of pins and contacts. To the opposite side of their row of pins and contacts there is another wall 153 (FIG. 9). The spring supports are themselves generally cross sectionally arcurate in shape. When the contacts bear against the spring supports they flex to bear against and partially enclose buttresses as at 154 which project upwardly from the base. The contacts also include barbs as at 156 which extend from the base members to help engage the contacts with the base. It will be also noted that the cover may also be structurally improved by means of a reinforcing rib 160 which extends upwardly from and transversely across the cover over essentially its entire width. Relief spaces as at 136 are also provided.

Figure 11:
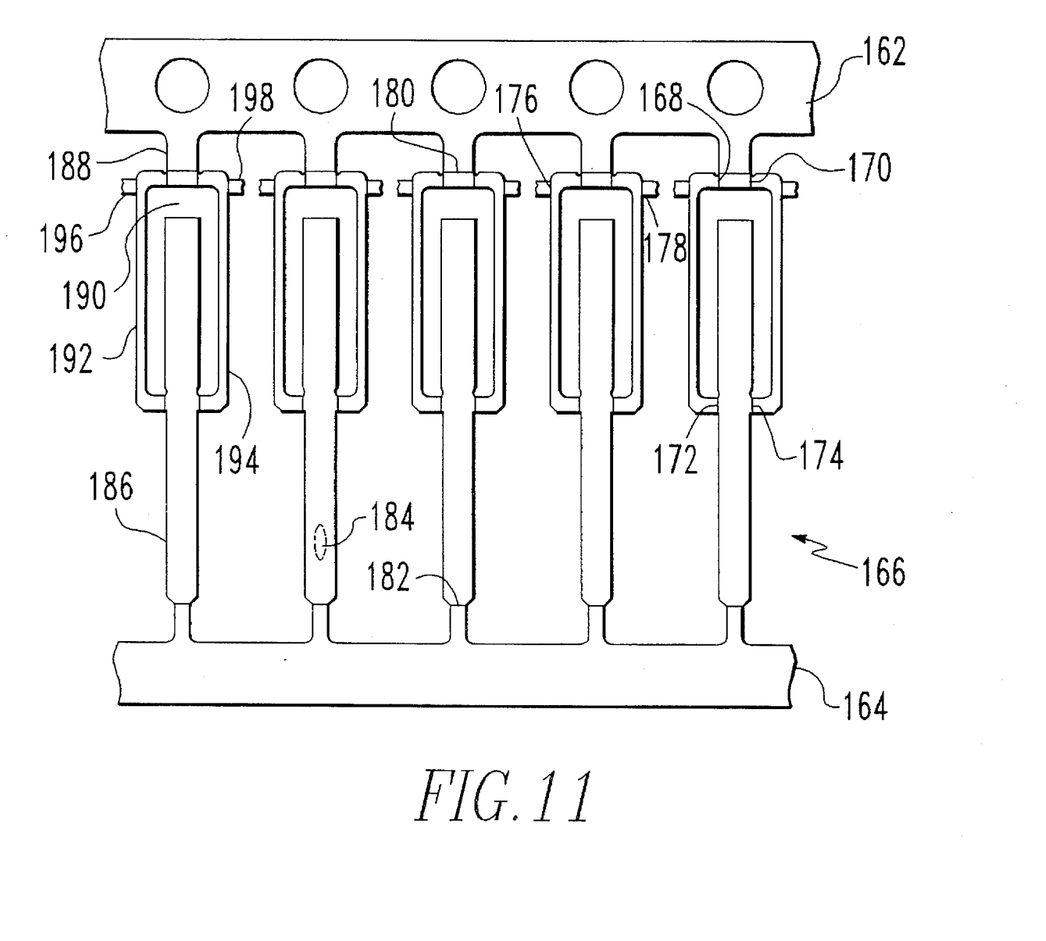
FIG. 11 is a front elevational view of a blank useful in making components used in the PGA socket shown in FIG. 8.

A blank from which the contact and integral spring support can be made is shown in FIG. 11. This blank has a top strip 162, a bottom strip 164 and a plurality of contact sections as at 166. In manufacturing the contact and integral spring support each of the spring support elements is first bent rearwardly by about 90° at points as at 168, 170, 172 and 174 to form the arcurate arms are then bent forward by about 90° as at 176 and 178 to form the arcurate arms. The contact and integral spring supports are then removed from the top and bottom strips at points as at 180, 182. A barb will be stamped onto the contact as at point 184. Before the contacts are removed from the top strip they are inserted into their positions in the base. The carrier top strip can then be removed. When the entire base is loaded, a plate element of an application machine can be addressed to all the rows and final insertion is done by depressing the plate. As the plate depresses the contact, the terminal ends of the arcurate arms will enter the slot in the side wall. This action adds support and retention to the contact.

It will be understood that this invention also encompasses a blank in which a lower vertical member as at 186 extends from a lower contact strip and an upper vertical member 188 extends downwardly from the top contact strip to a position where there is a vertical space 190 between said strips. Arcuate members 192 and 194 extend outwardly and upwardly from the lower vertical and extend upwardly and then inwardly to connect to the upper vertical member. Horizontal projections 196 and 198 project from the arcuate members.

It will be appreciated that in this additional embodiment support will be provided for the contacts and it will be unlikely that they will be sheared by the closing action of the contact.

While the invention has been described and illustrated with reference to specific embodiments, those skilled in the art will recognize that modification and variations may be made without departing from the principles of the invention as described herein above and set forth in the following claims.

What is claimed is:

1. A pin grid array socket for connecting an integrated circuit (IC) having a plurality of pins to a circuit substrate, said socket comprising:

a base having a plurality of contacts and said base being mountable on said circuit substrate so that said contacts can be directly electrically connected to said circuit substrate said base having at least two side walls therein, each of said side walls having a plurality of support receiving slots;

a cover having a plurality of insertion holes for receiving said plurality of pins and said cover being attached to said base and slidably from a first position to a second position so that said plurality of pins can be moved from said first position to said second position to form an electrical interface with said plurality of contacts;

a plurality of buttresses connected to said cover each of said buttresses directly supporting a corresponding pin when the cover is in the first and second positions and said contacts each comprising a moveable contact beam element for engaging the corresponding pin, a base member including a barb for helping engage the contact with the base and an integral spring support means having an opposed pair of transverse arcuate arms each of said arcuate arms having a bent portion bearing against one of the side walls and a terminal end portion which engages one of the slots in one of the side walls of the base, wherein the base further comprises a plurality of buttresses projecting upwardly therefrom for directly supporting the contacts.

\* \* \* \* \*